United States Patent
Gilmer et al.

[11] Patent Number: 5,821,172
[45] Date of Patent: Oct. 13, 1998

[54] OXYNITRIDE GTE DIELECTRICS USING NH$_3$ GAS

[75] Inventors: Mark C. Gilmer, Austin; Mark I. Gardner, Cedar Creek, both of Tex.

[73] Assignee: Advanced Micro Devices, Inc.

[21] Appl. No.: 779,264

[22] Filed: Jan. 6, 1997

[51] Int. Cl.$^6$ ................................ H01L 21/322
[52] U.S. Cl. .................. 438/769; 438/769; 438/770; 438/786; 438/775; 438/399
[58] Field of Search .................. 437/235, 238, 437/241; 438/769, 786, 770, 775, 399

[56] References Cited

U.S. PATENT DOCUMENTS

| | | | |
|---|---|---|---|
| 4,472,212 | 9/1984 | Kinsbron | 148/188 |
| 4,556,585 | 12/1985 | Abernathey et al. | 427/85 |
| 5,071,790 | 12/1991 | Kim | 437/195 |
| 5,397,720 | 3/1995 | Kwong et al. | 437/40 |
| 5,403,786 | 4/1995 | Hori | 438/585 |
| 5,407,870 | 4/1995 | Okada et al. | 437/241 |
| 5,436,481 | 7/1995 | Egawa et al. | 257/324 |
| 5,464,792 | 11/1995 | Tseng et al. | 438/786 |
| 5,512,519 | 4/1996 | Hwang | 438/770 |
| 5,541,141 | 7/1996 | Cho | 437/239 |
| 5,631,199 | 5/1997 | Park | 438/770 |
| 5,712,208 | 1/1998 | Tseng et al. | 438/775 |
| 5,736,454 | 4/1998 | Hwu et al. | 438/585 |

FOREIGN PATENT DOCUMENTS

| | | | |
|---|---|---|---|
| 402002624 | 1/1990 | Japan | 438/399 |
| 406069198 | 3/1994 | Japan | 438/399 |
| 406104252 | 4/1994 | Japan | 438/399 |

OTHER PUBLICATIONS

Yoon et al., MOS Characteristics of NH3–Nitrided N20–Grown Oxides, IEEE, vol. 14, No. 4, pp. 179–181, Apr. 1993.

Primary Examiner—Charles L. Bowers, Jr.
Assistant Examiner—Thanh Nguyen
Attorney, Agent, or Firm—Kevin L. Daffer; Conley, Rose & Tayon

[57] ABSTRACT

A semiconductor manufacturing process in which a single crystal silicon semiconductor substrate is immersed in an oxidation chamber maintained at a first temperature preferably between 400° and 700° C. for a first duration. During the first duration, the oxidation chamber comprises a first ambient gas of N$_2$ or Argon. Thereafter, the ambient temperature within the oxidation chamber is ramped to a second temperature in the range of approximately 600° to 1100° C. NH$_3$ is then introduced into the oxidation chamber simultaneously with either NO or N$_2$O to form an oxynitride layer. Thereafter, a conductive gate structure is formed on the oxynitride layer and a source/drain impurity distribution is introduced into a pair of source/drain regions laterally displaced on either side of the channel region of the semiconductor substrate. The channel region is aligned with the conductive gate. Preferably, the resistivity of an epitaxial layer of the semiconductor substrate is in the range of approximately 10 to 15 Ω-cm. In one embodiment, the first ambient gas further includes 1 to 10% oxygen and the first temperature is in the range of approximately 600° C. to 700° C. In one embodiment, a thin base oxide film consisting essentially of silicon an oxygen is formed on the upper surface of the semiconductor substrate prior to the oxynitride formation. In one embodiment of the invention, the oxynitride layer is annealed in an N$_2$ ambient at an anneal temperature in the range of approximately 600° C. to 1100° C. for a duration in the range of 30 seconds to 20 minutes.

13 Claims, 2 Drawing Sheets

OXYNITRIDE GTE DIELECTRICS USING NH₃ GAS

BACKGROUND OF THE INVENTION

1. Field of the Invention

This invention relates to semiconductor fabrication and more particularly to an improved method for forming a transistor by incorporating nitrogen into the gate dielectric at the interface of the dielectric and the substrate.

2. Description of the Relevant Art

The fabrication of MOS (metal-oxide-semiconductor) transistors within a semiconductor substrate is well known. Typically, the substrate is divided into a plurality of active and isolation regions through an isolation process such as field oxidation or shallow trench isolation. A thin oxide is then grown on an upper surface of the semiconductor substrate in the active regions. This thin oxide serves as the gate oxide for subsequently formed transistors. Next, a plurality of polysilicon gate structures are formed wherein each polysilicon gate traverses an active region effectively dividing the active region into two regions referred to as the source region and the drain region. After formation of the polysilicon gates, an implant is performed to introduce an impurity distribution into the source/drain regions.

As transistor geometries shrink below 0.5 micron, the limitations of conventional transistor processing become more apparent. As the thickness of the gate oxide decreases below 50 angstroms, devices become more susceptible to diffusion of electrically active impurities located in the conductive gate structure across the gate oxide and into the active area of the transistor where the impurities can alter the threshold voltage of the device. This problem is especially acute for boron implanted gate structures. In addition, thinner oxides increase concerns about hot carrier damage and oxide breakdown. Still further, as devices become smaller and more densely packed upon a semiconductor substrate surface, it becomes increasingly important to minimize the leakage current of each individual transistor. It is believed that leakage current can be created by a scattering effect that occurs as electrons traverse the channel between a device's source region and drain region. As the number of transistor devices within a single integrated circuit increases, leakage current can become significant enough to raise the temperature of the semiconductor substrate slowing the device and, eventually, raising the temperature above the operational limit of the device.

Nitrogen bearing gate dielectrics including oxynitride gate dielectrics have been used to enhance the quality of thin (i.e., less than 100 angstroms) gate oxides and to reduce boron penetration. In Kwong (U.S. Pat No. 5,397,720), for example, a method of forming an oxynitride gate electric is disclosed. The Kwong method consists essentially of growing an oxynitride layer in an $N_2O$ ambient and thereafter increasing the nitrogen concentration within the dielectric by introducing heated $NH_3$, Unfortunately, the Kwong method results in a nitrogen concentration profile that has a maximum at the substrate/dielectric interface. In addition to its tendency to limit boron penetration, nitrogen atoms in close proximity to the transistor channel region are believed to undesirably limit the carrier mobility within the channel resulting in slower devices. In addition, the Kwong method results in a slow dielectric growth rate during the $N_2O$ phase of the process. Similarly, in Cho (U.S. Pat. No. 5,541,141), an oxynitride gate dielectric is grown with a 3-stage process. During the first and third phases, an $N_2O$ ambient is used. During the second phase, $NH_3$ is added to the $N_2O$ mixture to control the oxidation rate and the influx of nitrogen to the oxynitride film. Like the Kwong method, the Cho method results in a nitrogen concentration having a peak at the silicon substrate interface.

Therefore, it would be highly desirable to fabricate MOS gate dielectrics in a manner that would improve the gate dielectric quality and prevent the penetration of boron atoms into the transistor channel without substantially reducing the carrier mobility within the transistor channel and without a significant decrease in the oxidation rate.

SUMMARY OF THE INVENTION

The problems identified above are in large part addressed by a semiconductor manufacturing process in which an oxynitride is incorporated into the gate dielectric. Incorporating nitrogen into the gate dielectric increases dielectric reliability and significantly reduces penetration of boron from the conductive gate into the transistor channel. In the preferred embodiment, the nitrogen concentration peak is displaced from the dielectric/substrate interface to minimize the impact on carrier mobility. The improved process has an increased oxidation rate and results in a film that has a higher concentration of nitrogen.

Broadly speaking, the present invention contemplates a manufacturing process for forming a semiconductor transistor. A single crystal silicon semiconductor substrate is provided. The substrate is loaded into an oxidation chamber maintained at a first temperature for a first duration. The first temperature is preferably between 400° C. and 700° C. During the first duration, the oxidation chamber comprises a first ambient gas of $N_2$ or Argon. After the first duration, the ambient temperature within the oxidation chamber is ramped to a second temperature. The second temperature is in the range of approximately 600° C. to 1100° C. After the ambient temperature within the oxidation chamber has stabilized at the second temperature, $NH_3$ is introduced into the oxidation chamber simultaneously with either NO or $N_2O$. The ambient temperature is maintained at the second temperature for a second duration during which time an oxynitride layer is formed. Thereafter, a conductive gate structure is formed on the oxynitride layer and a source/drain impurity distribution is introduced into a pair of source/drain regions. The source/drain regions are laterally displaced on either side of the channel region of the semiconductor substrate. The channel region is aligned with the conductive gate.

Preferably, the semiconductor substrate includes a p-type epitaxial layer formed on a p+silicon bulk. The resistivity of the epitaxial layer is preferably in the range of approximately 10 to 15 Ω-cm. In one embodiment, the first ambient gas further includes oxygen and the first temperature is in the range of approximately 600° C. to 700° C. A base oxide film forms on the upper surface of the semiconductor substrate. In this embodiment, a preferred concentration of the oxygen in the first ambient is in the range of approximately 1 to 10%. The base oxide film consists essentially of silicon and oxygen. A preferred thickness of the base oxide is between approximately 5 to 25 angstroms. The $NH_3$ in the oxidation chamber during the second duration is preferably in the range of approximately 1 to 15%. The conductive gate is preferably formed by chemically vapor depositing polysilicon at a temperature in the range of approximately 500° C. to 650° C. at a pressure preferably less than approximately 2 torrs. A gate impurity distribution is then implanted into the polysilicon to reduce the sheet resistivity of the polysilicon to less than approximately 500 Ω/square. The source/drain impurity distribution is preferably introduced into the semiconductor substrate by implanting ions of boron, phosphorous, or arsenic into the pair of source/drain regions. A preferred implant dose is greater than approximately $10^{15}$ atoms/cm$^2$. In one embodiment of the invention, the oxynitride layer is annealed in an N$_2$ ambient at an anneal temperature in the range of approximately 600° C. to 1100° C. for a duration in the range of 30 seconds to 20 minutes. In a first embodiment, the oxidation chamber is an oxidation furnace. In a second embodiment, the oxidation chamber is a rapid thermal process apparatus. The oxidation rate during the forming of the oxynitride is preferably in the range of 5 to 15 angstroms per minute. In one embodiment, nitrogen is introduced into the conductive gate, preferably with an ion implantation, to further reduce the likelihood of boron penetration into the transistor channel.

The present invention further contemplates a transistor. The transistor includes a single crystal semiconductor substrate. A gate dielectric layer is formed on the semiconductor substrate. The gate dielectric layer includes a nitrogen distribution. A peak concentration of the nitrogen distribution is vertically displaced above an interface between the gate dielectric and the semiconductor substrate by a first displacement. The transistor further includes a conductive gate formed on the gate dielectric layer and a source/drain impurity distribution substantially contained within a pair of source/drain regions. The pair of source/drain regions are laterally displaced on either side of a channel region of the semiconductor substrate. The channel region is aligned with the conductive gate. Preferably, the first displacement is in the range of approximately 5 to 25 angstroms. The gate dielectric layer, in a preferred embodiment, includes an oxynitride formed on a base oxide layer. The peak concentration of the nitrogen distribution is preferably located within the oxynitride layer. The base oxide layer thickness is preferably in the range of approximately 5 to 25 angstroms. The peak concentration of the nitrogen distribution is in the range of approximately $10^{17}$ to $10^{20}$ atoms/cm$^2$. The conductive gate preferably comprises polysilicon. A sheet resistivity of the polysilicon is less than approximately 500 $\Omega$/square. In one embodiment, the polysilicon further includes a second nitrogen distribution to further reduce the probability of boron penetration into the transistor channel region.

BRIEF DESCRIPTION OF THE DRAWINGS

Other objects and advantages of the invention will become apparent upon reading the following detailed description and upon reference to the accompanying drawings in which.

Figure 1:
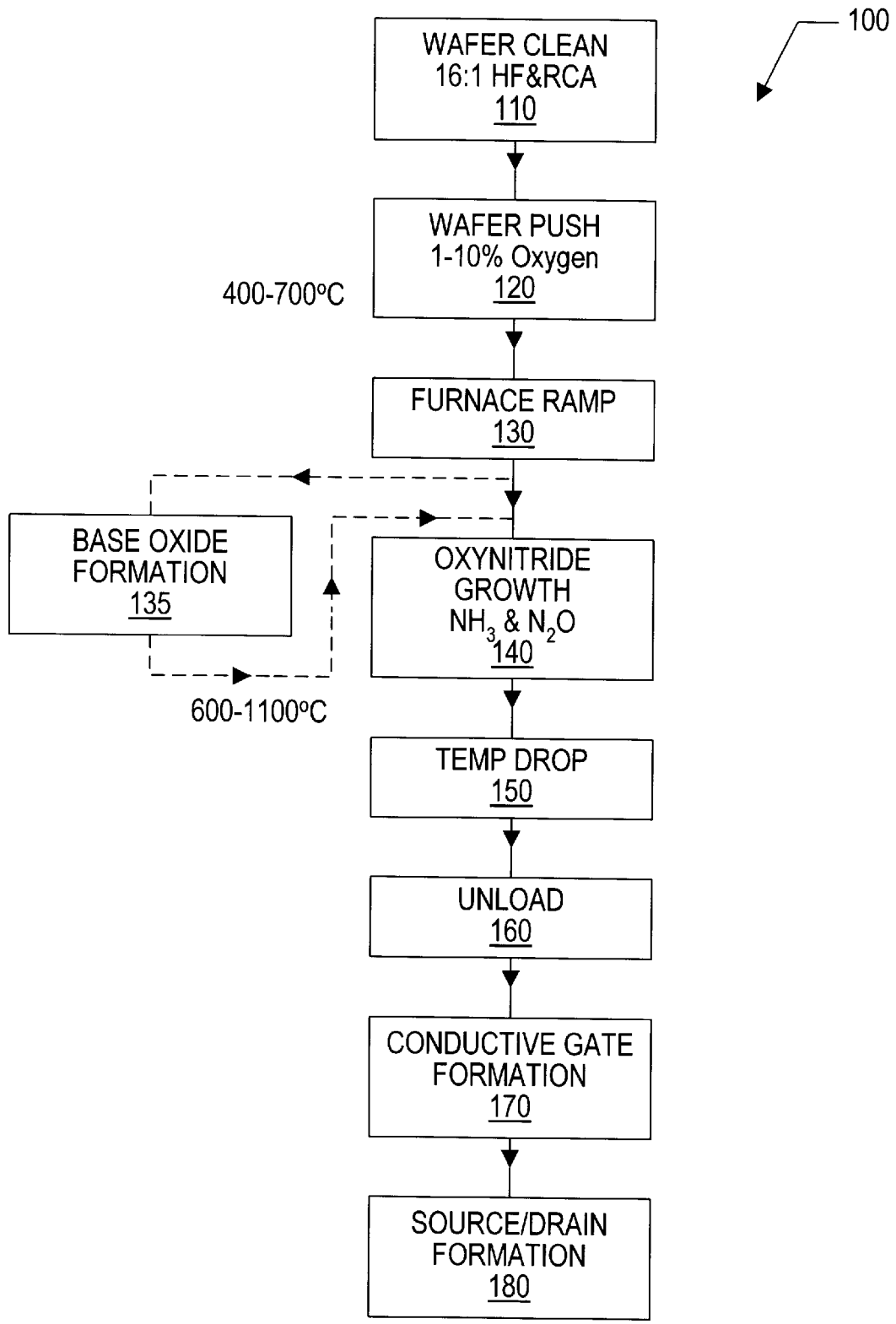
FIG. 1 is a flow diagram of a semiconductor process for incorporating nitrogen into the gate dielectric of an MOS transistor.

While the invention is susceptible to various modifications and alternative forms, the specific embodiments hereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIG. 1., a flow diagram for a process of forming an oxynitride gate dielectric in accordance with the present invention is shown. Process 100 includes a wafer clean 110, a wafer push 120, furnace ramp 130, oxynitride growth 140, temperature drop 150, wafer unload 160, gate formation 170, and source/drain formation 180. A single crystal semiconductor substrate, typically in the form of a substantially circular silicon wafer, is provided. In a presently preferred embodiment, the semiconductor substrate includes a p-type epitaxial layer formed on a p+silicon bulk. The crystal orientation of the substrate is 100. A resistivity of the epitaxial layer is preferably in the range of approximately 10 to 15 $\Omega$-cm. Prior to the formation of the oxynitride dielectric, an upper surface of the semiconductor substrate is cleaned in the process step shown in the flow diagram as reference numeral 110. The preferred wafer clean includes the steps of immersing the semiconductor substrate in a 10:1 HF solution to remove any residual oxide and thereafter performing a standard RCA clean. In a typical RCA clean, a wafer is immersed in a solution of H$_2$O-NH$_4$OH-H$_2$O$_2$ in an approximate ratio of 5:1:1 by volume heated to approximately 75° C. to 80° C. After five to fifteen minutes in the solution, the wafers are removed and rinsed in deionized water. This portion of the cleaning procedure is designed to remove residual organic contaminants found on the wafer. Thereafter, to remove any oxide formed during the immersion in the first solution, the wafer is submerged for approximately 15 seconds into a mixture of 10:1 HF. To remove any atomic and ionic contaminants, the wafer is subsequently immersed in a solution of H$_2$O:HCl:H$_2$O$_2$ in an approximate ratio of 6:1:1 by volume heated to approximately 75° C. to 80° C. The wafer is held in this HCl solution for approximately 10 to 15 minutes. For further information regarding the standard RCA clean, see 1 Stanley Wolf and Richard N. Tauber, *Silicon Processing For The VLSI Era* 516–17 (Lattice Press 1986).

Subsequent to wafer clean 110, the semiconductor substrate is immersed into an oxidation chamber maintained at a first temperature between approximately 400° C. and 700° C. for a first duration. In a preferred embodiment indicated in FIG. 1 as reference numeral 120, the immersing of the semiconductor substrate is accomplished by loading the semiconductor substrate into a quartz or silicon carbide boat and pushing the boat into a gate oxidation furnace. The temperature is preferably between approximately 400° C. and 700° C. during the push. In a presently preferred embodiment, the first ambient gas predominantly comprises an inert species such as N$_2$ or Argon with a 1 to 10% mixture of oxygen. In lieu of pushing the wafer into an oxidation furnace, the wafer may be placed into the process chamber of a rapid thermal apparatus. In an alternative embodiment, (not shown in FIG. 1) the first ambient gas may consist of pure Argon. After the semiconductor substrate has been immersed into the oxidation chamber, furnace ramp 130 is performed during which the ambient temperature within the oxidation chamber is ramped to a second temperature. In the presently preferred embodiment, the second temperature is in the range of approximately 600° C. to 1100° C. Thereafter, NH$_3$ is introduced into the oxidation chamber simultaneously with a nitrogen-oxide species such as NO or N$_2$O. The ambient temperature within the oxidation chamber is maintained at the second temperature for a second duration. In this manner, an oxynitride layer is formed. The oxynitride layer comprises silicon, oxygen, and nitrogen. The introduction of NH$_3$ into the oxidation chamber during the oxynitride layer formation facilitates an increased concentration of nitrogen within the oxynitride layer. In a presently preferred embodiment, a peak concentration of nitrogen within the oxynitride layer is approximately $10^{17}$ to $10^{20}$ atoms/cm$^3$.

In one embodiment of the present invention a base oxide layer substantially devoid of nitrogen (i.e., consisting essentially of silicon and oxygen) is formed on an upper surface of the semiconductor substrate prior to oxynitride growth 140. In this embodiment, step 120 is preferably accomplished in a first ambient that includes a 1 to 10% oxygen distribution at a temperature of approximately 600° C. to 700° C. Under these conditions, a base oxide layer, preferably 5 to 25 angstroms in thickness, is formed on the semiconductor substrate. Alternatively, the base oxide layer may be formed after furnace ramp 130 by introducing an oxygen species (without nitrogen) into the oxidation chamber prior to oxynitride growth 140. This optional base oxide formation process is indicated in FIG. 1 as reference numeral 135. The formation of a substantially nitrogen free silicon oxide layer between the silicon substrate and the oxynitride layer is believed to minimize the undesirable reduction of carrier mobility within the transistor channel due to the presence of nitrogen proximal to the dielectric/silicon interface. Accordingly, the present invention is believed to achieve the benefits of incorporating nitrogen into a gate dielectric of an MOS transistor, namely: reduced boron penetration and increased dielectric reliability, without suffering a decrease in carrier mobility. In addition, the presence of $NH_3$ within the oxidation chamber during oxidation growth 140 increases the oxidation rate such that the time required to produce a given thickness of gate dielectric is reduced. In a preferred embodiment, the oxidation rate during oxidation growth 140 is in the range of approximately 5 to 15 angstroms per minute. Subsequent to oxidation growth 140, the temperature within the oxidation chamber is reduced in the process step identified by reference numeral 150 in FIG. 1. In one embodiment, an anneal cycle may be performed prior to temperature drop 150. In this embodiment, the oxynitride layer is annealed in an $N_2$ ambient at an anneal temperature in the range of approximately 600° C. to 1100° C. The anneal is carried out for a duration of approximately 30 seconds to 20 minutes in the preferred embodiment. As indicated previously, the oxidation chamber may comprise a rapid thermal apparatus. In a rapid thermal process, a single semiconductor substrate is placed in a chamber and rapidly heated to a desired temperature for a relatively short duration compared with the duration contemplated for an oxidation furnace.

After the formation of the gate dielectric layer, a conductive gate is formed on the oxynitride layer in process step 170. Preferably, the formation of the conductive gate includes the step of chemically vapor depositing polysilicon. The polysilicon is preferably deposited at a temperature in the range of approximately 500° C. to 650° C. at a pressure preferably less than approximately 2 torrs. Thereafter, the sheet resistivity of the polysilicon is reduced by implanting a gate impurity distribution into the polysilicon. In one embodiment, a p-type impurity such as boron is implanted into the polysilicon if the transistor is of the p-channel variety while phosphorous or arsenic is implanted into the n-channel polysilicon. In another embodiment, the conductive gate may comprise a metal such as aluminum, copper, tungsten, or an alloy thereof. In one embodiment, a second nitrogen distribution may be introduced into the conductive gate to further prevent the penetration of boron into the transistor channel region. In such an embodiment, the introduction of the second nitrogen distribution is preferably accomplished with an ion implantation into the conductive gate layer using an implant dose in the range of approximately $10^{13}$ to $10^{15}$ atoms/cm². After the conductive gate layer has been appropriately doped, the conductive gate structure is formed by patterning the conductive gate with conventional photolithography and etching techniques. Subsequent to the formation of the conductive gate, the source and drain terminals of the transistor are formed in process step 180 by introducing a source/drain impurity distribution into a pair of source/drain regions within the semiconductor substrate. In a preferred embodiment, the source/drain impurity distribution is introduced into the source/drain regions with an ion implantation using an implant dose greater than approximately $10^{15}$ atoms/cm². The formation of the conductive gate and the source/drain regions are well known to those skilled in the art of semiconductor processing.

Figure 2:
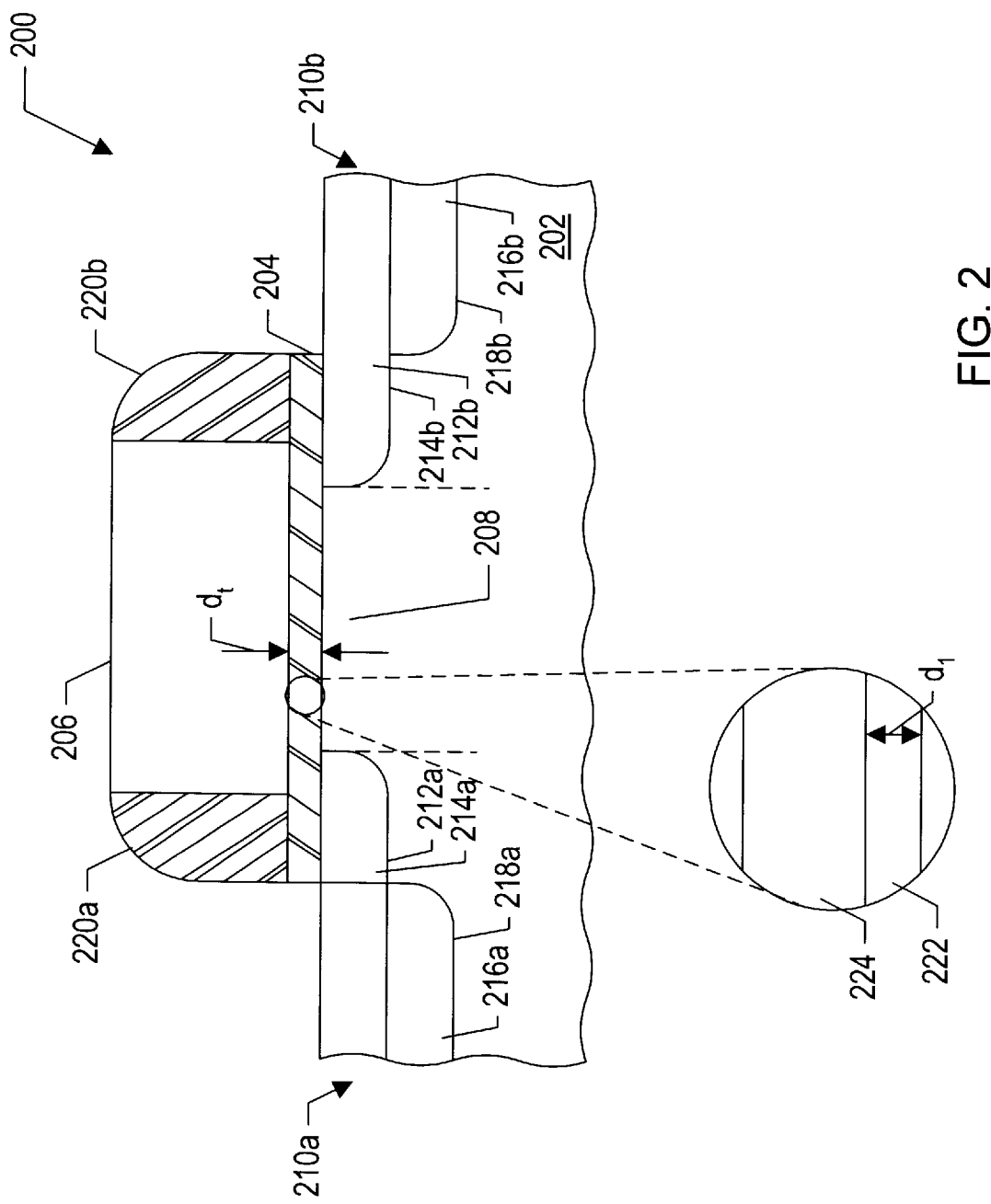
FIG. 2 is a partial cross-sectional view of a semiconductor transistor including a nitrogen bearing gate dielectric.

Turning now to FIG. 2, a transistor 200 is shown. Transistor 200, formed in accordance with semiconductor process 100 as described with respect to FIG. 1, includes a semiconductor substrate 202, a gate dielectric 204, a conductive gate 206 and a pair of source/drain regions 210a and 210b laterally displaced on either side of a channel region 208. In the preferred embodiment, a starting material for semiconductor substrate 202 includes a p-type epitaxial layer formed on a p+silicon bulk. Gate dielectric layer 204 includes a nitrogen distribution. In the preferred embodiment, a peak concentration of the nitrogen distribution within gate dielectric 204 is vertically displaced above upper surface 201 of semiconductor substrate 202 by a first displacement $d_1$. In the preferred embodiment, the first displacement is in the range of approximately 5 to 25 angstroms. A preferred thickness $d_t$ of gate dielectric 204 is preferably less than 50 angstroms and still more preferably in the range of approximately 25 to 35 angstroms. In one embodiment, gate dielectric layer 204 includes oxynitride layer 224 formed upon a base oxide layer 222. In this embodiment, base oxide layer 222 provides a nitrogen depleted region between conductive gate 206 and silicon substrate 200. A preferred thickness of base oxide layer 222 is in the range of approximately 5 to 25 angstroms. The presence of a nitrogen depleted base oxide layer 222 minimizes the undesirable reduction of carrier mobility and with it, device speed, due to the presence of nitrogen proximal to or within channel region 208 of semiconductor substrate 202. In a presently preferred embodiment, the peak nitrogen concentration within gate dielectric 204 is in the range of approximately $10^{17}$ to $10^{20}$ atoms/cm². Transistor 200 further includes conductive gate 206. Conductive gate 206 is aligned over channel region 208 or semiconductor substrate 202. In one embodiment, conductive gate 206 is a heavily doped polysilicon having a sheet resistivity less than approximately 500 Ω/square. In an alternative embodiment, conductive gate 206 comprises a metal such as aluminum, copper, tungsten, or an alloy thereof. Conductive gate 206 may include a nitrogen distribution to further prevent the penetration of electrically active impurities within conductive gate 206 such as boron from penetrating gate dielectric 204 to channel region 208 of semiconductor substrate 202. Ideally, a nitrogen distribution within conductive gate 206 will have a peak concentration proximal to (i.e.; within approximately 50 angstroms) the interface between conductive gate 206 and gate dielectric 204. Transistor 200 further includes a pair of source/drain impurity distributions 210a and 210b which are laterally displaced on either side of transistor channel 208. In the embodiment shown in FIG. 2 the source/drain impurity distributions 210 comprise a lightly doped impurity distribution 212a and 212b substantially located within a pair of lightly doped regions 214a and 214b and a heavily doped source/drain impurity distribution 216a and 216b located within heavily doped regions 218a and 218b respectively. The lightly doped regions shown in FIG. 2 are well known in the field of semiconductor processing and are more fully described in 2 Stanley Wolf, *Silicon Processing For VLSI Era* 354–56 (Lattice Press 1990). Consistent with the presence of lightly doped regions 214a and 214b, transistor 200 further includes a spacer structure 220a and 220b formed on respective sidewalls of conductive gate 206. Space structures 220a are preferably formed by depositing a conformal dielectric, preferably by depositing a TEOS film with a low pressure (i.e., less than 2 torrs) CVD process. Thereafter, the conformal dielectric is etched with an anisotropic etch process designed to leave behind space structures such as spacer structures 220 on vertical surfaces of the underlying topography.

It will be apparent to those skilled in the art having the benefit of this disclosure that the present invention contemplates a method and structure for reducing boron penetration in MOS transistors, increasing the gate dielectric quality and minimizing the reduction in carrier mobility within the channel region of the transistor. It is understood that the form of the invention shown and described in the detailed description and the drawings are to be taken merely as presently preferred examples of how nitrogen can be incorporated into the gate dielectric and the conductive gate of an MOS transistor. It is intended that the following claims be interpreted broadly to embrace all the variations of the preferred embodiments disclosed.

What is claimed is:

1. A manufacturing process for forming a semiconductor transistor, comprising:

providing a semiconductor substrate, wherein said semiconductor substrate comprises single crystal silicon;

immersing said semiconductor substrate into an oxidation chamber maintained at a first temperature between 400° and 700° C. for a first duration such that a base oxide layer forms on an upper surface of said semiconductor substrate, said oxidation chamber comprising a first ambient gas and a second ambient gas, wherein said first ambient is selected from the group consisting of $N_2$ and Argon, and wherein said second ambient gas comprises oxygen;

ramping the ambient temperature within said oxidation chamber to a second temperature in the range of approximately 600° to 1100° C.;

simultaneously introducing $NH_3$ and a gas selected from the group consisting of NO and $N_2O$ into said oxidation chamber while maintaining the ambient temperature within said oxidation chamber at said second temperature for a second duration to form an oxynitride layer on an upper surface of said base oxide layer;

forming a conductive gate structure on said oxynitride layer; and introducing a source/drain impurity distribution into a pair of source/drain regions laterally displaced on either side of a channel region of said semiconductor substrate wherein said channel region is aligned with said conductive gate.

2. The process of claim 1, wherein said semiconductor substrate includes a p-type epitaxial layer formed on a p+silicon bulk, wherein a resistivity of said epitaxial layer is in the range of approximately 10 to 15 $\Omega$-cm.

3. The process of claim 1, wherein said first temperature is in the range of approximately 600° to 700° C.

4. The process of claim 1, wherein a concentration of said oxygen in said second ambient is in the range of approximately 1 to 10%.

5. The process of claim 1, wherein said base oxide film is substantially devoid of nitrogen.

6. The process of claim 1, wherein a thickness of said base oxide film is between approximately 5 to 25 angstroms.

7. The process of claim 1, wherein a concentration of said $NH_3$ in said oxidation chamber is approximately 1 to 15 percent.

8. The process of claim 1, wherein the step of forming a conductive gate structure comprises:

chemically vapor depositing polysilicon at a temperature in the range of approximately 500° to 650° C. at a pressure less than approximately 2 torrs; and implanting a gate impurity distribution into said polysilicon to reduce the sheet resistivity of said polysilicon to less than approximately 500 $\Omega$/square.

9. The process of claim 1, wherein the step of introducing said source/drain impurity distribution comprises implanting ions selected from the group consisting of boron, phosphorous, and arsenic into said pair of source/drain regions, wherein an implant dose for said ion implanting is greater than approximately $10^{15}$ atoms/cm$^2$.

10. The process of claim 1, further comprising, subsequent to the step of introducing said $NH_3$, annealing said oxynitride layer in an $N_2$ ambient at an anneal temperature in the range of approximately 600° to 1100° C. for a duration in the range of 30 seconds to 20 minutes.

11. The process of claim 1 wherein said oxidation chamber comprises an oxidation furnace.

12. The process of claim 1 wherein said oxidation chamber comprises a rapid thermal process apparatus.

13. The process of claim 1 wherein the oxidation rate during said forming of said oxynitride is in the range of approximately 5 to 15 angstroms/minute.

* * * * *